United States Patent
Ding et al.

(10) Patent No.: US 9,184,716 B2
(45) Date of Patent: Nov. 10, 2015

(54) LOW NOISE AMPLIFIER AND RECEIVER

(71) Applicant: ADVANCED SEMICONDUCTOR ENGINEERING INC., Kaohsiung (TW)

(72) Inventors: Jaw-Ming Ding, Taoyuan County (TW); Jia-Hong Mou, Keelung (TW)

(73) Assignee: ADVANCED SEMICONDUCTOR ENGINEERING INC., Kaohsiung (TW)

( * ) Notice: Subject to any disclaimer, the term of this patent is extended or adjusted under 35 U.S.C. 154(b) by 14 days.

(21) Appl. No.: 14/228,661

(22) Filed: Mar. 28, 2014

(65) Prior Publication Data

US 2015/0280672 A1   Oct. 1, 2015

(51) Int. Cl.
| | |
|---|---|
| H03F 3/00 | (2006.01) |
| H03G 3/30 | (2006.01) |
| H03F 3/19 | (2006.01) |
| H03F 1/02 | (2006.01) |

(52) U.S. Cl.
CPC ........... *H03G 3/3036* (2013.01); *H03F 1/0205* (2013.01); *H03F 3/19* (2013.01); *H03F 3/00* (2013.01); *H03F 2200/294* (2013.01); *H03F 2200/451* (2013.01)

(58) Field of Classification Search
CPC ............... H03F 3/00; H03F 1/00; H03F 5/00; H03F 1/0205; H03F 2200/451; H03F 2200/294; H03F 3/19; H03G 3/3036
See application file for complete search history.

(56) References Cited

U.S. PATENT DOCUMENTS

| | | | | |
|---|---|---|---|---|
| 6,717,471 B2* | 4/2004 | Arayashiki et al. | ........... | 330/278 |
| 2005/0073357 A1* | 4/2005 | Carpineto et al. | ................ | 330/2 |
| 2007/0262818 A1* | 11/2007 | Lee et al. | ....................... | 330/278 |
| 2008/0079499 A1* | 4/2008 | Tsai | .............................. | 330/311 |
| 2010/0271135 A1* | 10/2010 | Afsahi et al. | .................... | 330/296 |
| 2011/0095822 A1* | 4/2011 | Chan | .............................. | 330/254 |
| 2011/0210795 A1* | 9/2011 | Ohta et al. | .................... | 330/288 |
| 2011/0221531 A1* | 9/2011 | Kim et al. | ...................... | 330/284 |
| 2011/0291760 A1* | 12/2011 | Maruyama | .................... | 330/257 |
| 2014/0043102 A1* | 2/2014 | Su et al. | ......................... | 330/295 |
| 2014/0210435 A1* | 7/2014 | Nishikawa et al. | ........... | 323/271 |

FOREIGN PATENT DOCUMENTS

| | | |
|---|---|---|
| CN | 103117711 A | 5/2013 |
| CN | 103166581 A | 6/2013 |

* cited by examiner

*Primary Examiner* — Jean B Corrielus
(74) *Attorney, Agent, or Firm* — Foley & Lardner LLP; Cliff Z. Liu; Angela D. Murch

(57) ABSTRACT

A low noise amplifier is disclosed. The low noise amplifier comprises a current mirror circuit, a bias circuit, a cascode amplifying circuit and a power gain compensating circuit. The current mirror circuit is used for providing a first current and third current. The bias circuit is used for receiving a first current and third current and outputting a first bias voltage and a second bias voltage according to the first current and third current. The cascode amplifying circuit respectively receives the first bias voltage and the second bias voltage, and accordingly to work at an operation bias point. The power gain compensating circuit is used for receiving a RF output signal and accordingly outputs a gain compensating signal to the current mirror circuit so as to dynamically adjust current value of the first current and third current and further to compensates power gain of the low noise amplifier in order to increase 1 dB gain compression point (P1 dB).

16 Claims, 7 Drawing Sheets

LOW NOISE AMPLIFIER AND RECEIVER

BACKGROUND OF THE INVENTION

1. Field of the Invention

The instant disclosure relates to a low noise amplifier; in particular, to a high linearity low noise amplifier that can dynamically adjust the bias point to achieve high linearity and high P1 dB.

2. Description of Related Art

The wireless communication has developed dramatically. Nowadays, there are over 1 billion wireless mobile devices in the world. There are many bandwidths and communication protocols for mobile network, wide area network (WAN), local area network (LAN), public safety communication and military communication, which is hard to have the best implementation.

The Low Noise Amplifier (LNA) is generally used in the communication system, which is used for amplifying weak input signal received from antenna to be a signal with low noise figure. Moreover, the Low Noise Amplifier (LNA) is often configured at the front end of a communication system. Generally speaking, the Low Noise Amplifier (LNA) can reduce most of the noise and amplify the desired signals with frequencies near a center frequency. Therefore, it not only can increase the Signal-to-Noise Ratio (SNR) of the communication system, but also can increase quality of signal receiving. In the prior art, in conjunction with FIG. 1 and FIG. 2, FIG. 1 shows a circuit diagram of a traditional low noise amplifier and FIG. 2 shows a simulation waveform of a traditional high linearity low noise amplifier. FIG. 1 is a circuit diagram of U.S. Pat. No. 6,977,553. When input power of the RF input signal increases, P1 dB gain compression point of the traditional LNA is merely −24 dBm.

SUMMARY OF THE INVENTION

The instant disclosure provides a high linearity low noise amplifier with high P1 dB. The low noise amplifier comprises a current mirror circuit, a bias circuit, a cascode amplifying circuit and a power gain compensating circuit. The current mirror circuit provides a first current and a thir current according to a system voltage and a preset current, wherein the first current and the third current are mapping current of the preset current. The bias circuit is electrically connected to the current mirror circuit and is used for receiving the first current and outputting a first bias voltage and a second bias voltage according to the first current and the third current. The cascode amplifying circuit is electrically connected to the bias circuit so as to respectively receive the first bias voltage and the second bias voltage, and accordingly to work at an operation bias point. The cascode amplifying circuit is used for receiving and amplifying a RF input signal and accordingly outputs a RF output signal. The power gain compensating circuit is electrically connected between the cascode amplifying circuit and the current mirror circuit. The power gain compensating circuit is used for receiving the RF output signal and accordingly outputting a gain compensating signal to the current mirror circuit so as to dynamically adjust current value of the first current and the third current and further to compensates power gain of the low noise amplifier in order to increase linearity.

In an embodiment of the instant disclosure, current value of the first current increases correspondingly with power of the RF input signal, so as to dynamically adjust voltage values of the first bias voltage and the second bias voltage outputted by the bias circuit.

In an embodiment of the instant disclosure, the bias circuit comprises a first transistor and a second transistor. Gate of the first transistor is connected to the current mirror circuit and outputs the first bias voltage to the cascode amplifying circuit via a first resistor, source of the first transistor is connected to ground voltage. Drain and gate of the second transistor is connected together and receives the first current, source of the second transistor is connected to drain of the first transistor, and drain of the second transistor outputs the second bias voltage to the cascode amplifying circuit. the first transistor and the second transistor dynamically adjust voltage value of the first bias voltage and the second bias voltage respectively according to current value of the first current.

In an embodiment of the instant disclosure, the cascode amplifying circuit comprises an input capacitor, a third transistor, a fourth transistor, an output capacitor and an inductor. One terminal of the input capacitor receives the RF input signal. Gate of the third transistor is connected to gate of the first transistor via the first resistor and receives the first bias voltage, and is directly connected to another terminal of the input capacitor so as to receive the RF input signal, and source of the third transistor is connected to the ground voltage. Gate of the fourth transistor is connected to drain of the second transistor and receives the second bias voltage, and source of the fourth transistor is connected to drain of the third transistor, and drain of the fourth transistor receives a second current. One terminal of the output capacitor is connected to drain of the fourth transistor, and another terminal of the output capacitor outputs the RF output signal. One terminal of the inductor is connected to drain of the fourth transistor, and another terminal of the inductor is connected to the system voltage. The third transistor and the fourth transistor respectively work at the operation bias point according to the first bias voltage and the second bias voltage, and used for receiving and amplifying the RF input signal and accordingly outputting the RF output signal.

In an embodiment of the instant disclosure, the power gain compensating circuit comprises a compensation capacitor. One terminal of the compensation capacitor is connected to drain of the fourth transistor, and another terminal of the compensation capacitor is connected to the current mirror circuit, and the compensation capacitor receives the RF output signal and accordingly outputs the gain compensating signal to the current mirror circuit so as to dynamically adjust current value of the first current. The gain compensating signal is the RF output signal.

In an embodiment of the instant disclosure, the current mirror circuit comprises a bias current source, a fifth transistor, a sixth transistor, a seventh transistor and an eighth transistor. One terminal of the bias current source is connected to the ground voltage, and the bias current source has a preset current. Gate and drain of the fifth transistor is connected together and is connected to another terminal of the bias current source, and source of the fifth transistor is connected to the system voltage. Gate of the sixth transistor is connected to another terminal of the compensation capacitor so as to receive the gain compensating signal, drain of the sixth transistor is connected to drain of the second transistor and outputs the first current, and source of the sixth transistor is connected to the system voltage, wherein gate of the sixth transistor equals to voltage of the gain compensating signal. Gate of the seventh transistor is connected to gate of the fifth transistor, source of the seventh transistor is connected to the system voltage, and drain of the seventh transistor outputs a third current, wherein the third current is mapping current of the preset current. Gate and drain of the eighth transistor is connected together and is connected to drain of the seventh transistor also connected to gate of first transistor for receiving a third current, and source of the eighth transistor is connected the ground voltage. The sixth transistor dynamically adjusts gate voltage according to the gain compensating signal and further dynamically adjusts current value of the first current.

In an embodiment of the instant disclosure, the current mirror circuit further comprises a first feedback resistor. One terminal of the first feedback resistor is connected to gate of the sixth transistor, and another terminal of the first feedback resistor is connected to gate of the seventh transistor.

In an embodiment of the instant disclosure, the current mirror circuit further comprises a second feedback resistor. One terminal of the second feedback resistor is connected to gate of the seventh transistor, and another terminal of the second feedback resistor is connected to gate of the fifth transistor. The current value of the source current of the seventh transistor may be increased through ratio of resistor value between the first feedback resistor and the second feedback resistor, so that current value of the first current and third current may be correspondingly increased for increasing 1 dB gain compression point (P1 dB) of the low noise amplifier.

In an embodiment of the instant disclosure, when power of the RF input signal is smaller than a power threshold value, the first transistor and third transistor work at linear region so as to maintain linearity of the low noise amplifier; when power of the RF input signal is larger than a power threshold value, the first transistor and third transistor enter into saturation region from linear region and the first current increases according to increasing of alternative current (ac) component of gate voltage of the sixth transistor, so as to increase voltage value of the first bias voltage and the second bias voltage and further compensate power gain of the low noise amplifier.

The instant disclosure provides another a receiver, the receiver comprises a low noise amplifier, a demodulation circuit and a load. The low noise amplifier is used for receiving a RF input signal and outputting a RF output signal. The demodulation circuit is electrically connected to the low noise amplifier and is used for demodulating the RF output signal and outputting a demodulation signal. The load is electrically connected to the demodulation circuit and receives the demodulation signal. The low noise amplifier comprises a current mirror circuit, a bias circuit, a cascode amplifying circuit and a power gain compensating circuit. The current mirror circuit provides a first current according to a system voltage and a preset current, wherein the first current is mapping current of the preset current. The bias circuit is electrically connected to the current mirror circuit and is used for receiving the first current and outputting a first bias voltage and a second bias voltage according to the first current. The cascode amplifying circuit is electrically connected to the bias circuit so as to respectively receive the first bias voltage and the second bias voltage, and accordingly to work at an operation bias point. The cascode amplifying circuit is used for receiving and amplifying a RF input signal and accordingly outputs a RF output signal. The power gain compensating circuit is electrically connected between the cascode amplifying circuit and the current mirror circuit. The power gain compensating circuit is used for receiving the RF output signal and accordingly outputting a gain compensating signal to the current mirror circuit so as to dynamically adjust current value of the first current and the third current and further to compensates power gain of the low noise amplifier in order to increase 1 dB gain compression point (P1 dB).

To sum up, the low noise amplifier and the receiver provided by the instant disclosure feedbacks the RF output signal to the current mirror circuit via the power gain compensating circuit so as to dynamically adjust the mapping current, which thereby compensates power gain of the low noise amplifier in order to increase linearity, in other words, to increase 1 dB gain compression point (P1 dB).

For further understanding of the instant disclosure, reference is made to the following detailed description illustrating the embodiments and examples of the instant disclosure. The description is only for illustrating the instant disclosure, not for limiting the scope of the claim.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION OF PREFERRED EMBODIMENTS

It will be understood that, although the terms first, second, third, and the like, may be used herein to describe various elements, components, regions, layers and/or sections, these elements, components, regions, layers and/or sections should not be limited by these terms. These terms are only to distinguish one element, component, region, layer or section from another region, layer or section discussed below could be termed a second element, component, region, layer or section without departing from the teachings of the instant disclosure. As used herein, the term "and/or" includes any and all combinations of one or more of the associated listed items.

In the following instruction, embodiments together with drawings are for illustrating the low noise amplifier and receiver; however, the embodiments are not taken as limitations for the instant disclosure.

[One Embodiment of the Low Noise Amplifier]

Figure 1:
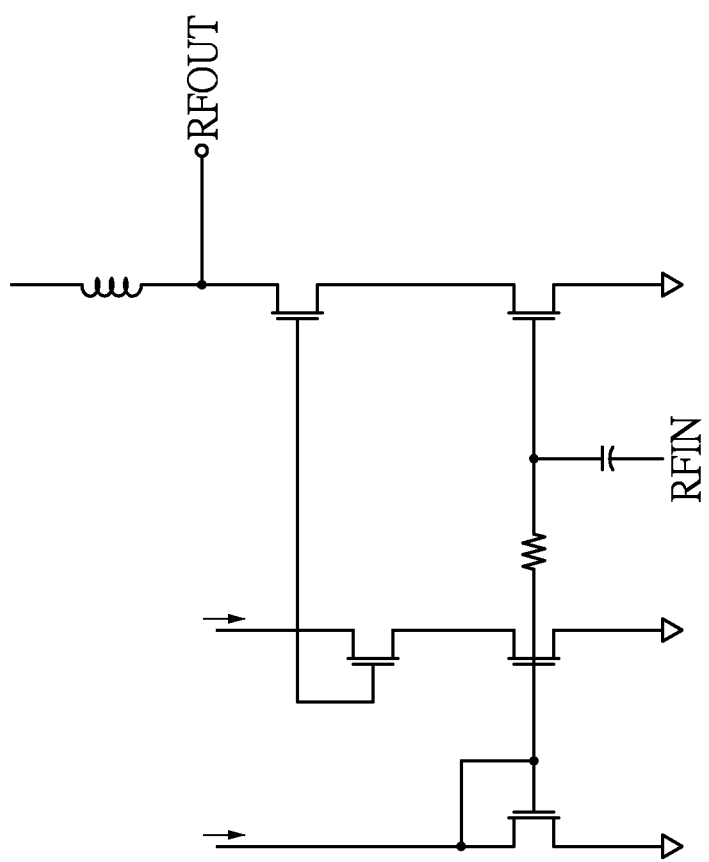
FIG. 1 shows a circuit diagram of a traditional low noise amplifier.
Figure 2:
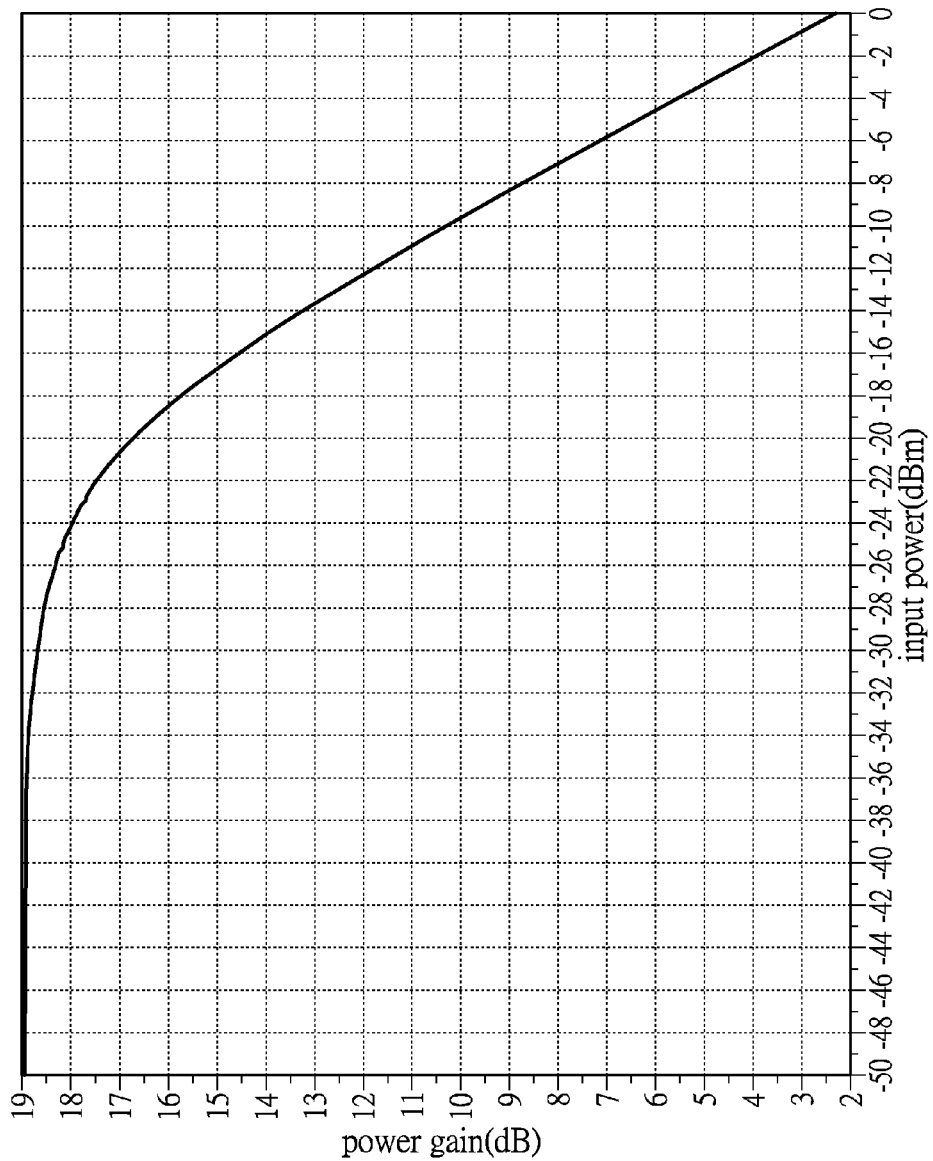
FIG. 2 shows a simulation waveform of a traditional low noise amplifier.
Figure 3:
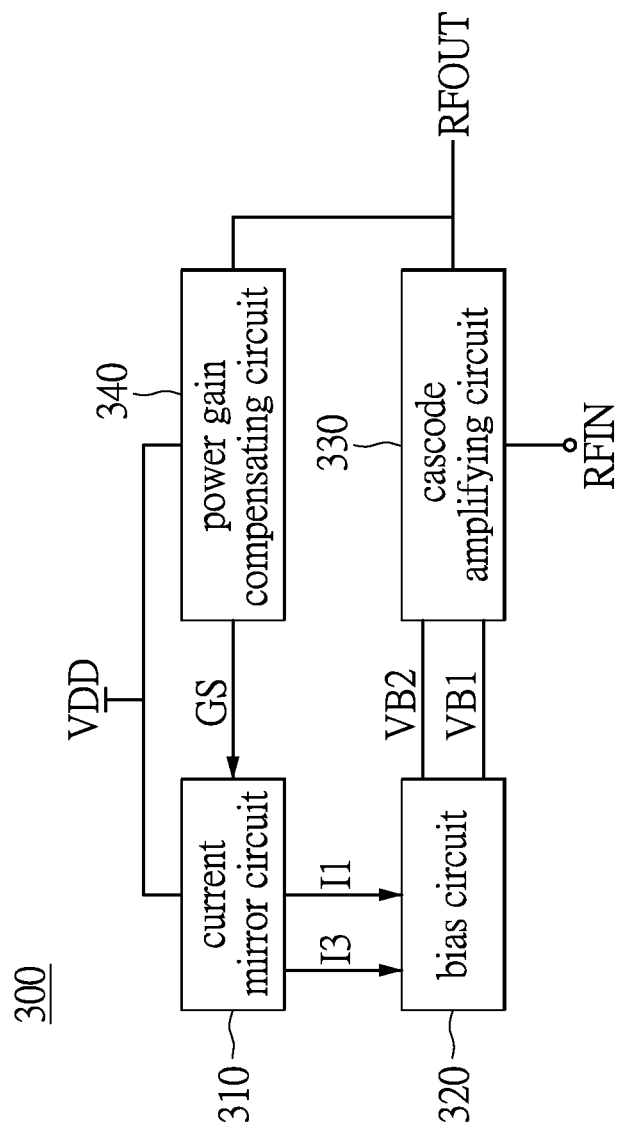
FIG. 3 shows a schematic block diagram of a low noise amplifier according to an embodiment of the instant disclosure.

Please refer to FIG. 3, FIG. 3 shows a schematic block diagram of a low noise amplifier according to an embodiment of the instant disclosure. As shown in FIG. 3, the low noise amplifier 300 comprises a current mirror circuit 310, a bias circuit 320, a cascode amplifying circuit 330 and a power gain compensating circuit 340. The current mirror circuit 310 is electrically connected to the bias circuit 320 and the system voltage VDD. The bias circuit 320 is electrically connected to the cascode amplifying circuit 330. The cascode amplifying circuit 330 is electrically connected to the power gain compensating circuit 340, and the power gain compensating circuit 340 is electrically connected to the current mirror circuit 310.

Regarding to the current mirror circuit 310, the current mirror circuit 310 of the instant disclosure is mainly used for providing the first current I1 and third current I3 according to a system voltage VDD and a preset current, wherein the first current is mapping current of the preset current.

Regarding to the bias circuit 320, the bias circuit 320 is used for receiving the first current I1 and third current I3 and correspondingly outputting the first bias voltage VB1 and the second bias voltage VB2 according to the first current I1 and third current I3. Moreover, in the present embodiment, the bias circuit 320 is used for biasing the cascode amplifying circuit 330 at a proper operation bias point.

Regarding to the cascode amplifying circuit 330, the cascode amplifying circuit 330 is used for respectively receiving the first bias voltage VB1 and the second bias voltage VB2 transmitted by the bias circuit 320. Also, the cascode amplifying circuit 330 works at the operation bias point respectively according to voltage values of the first bias voltage VB1 and the second bias voltage VB2. In addition, the cascode amplifying circuit 330 is used for receiving and amplifying the RF input signal RFIN and outputting the RF output signal RFOUT.

Regarding to the power gain compensating circuit 340, the power gain compensating circuit 340 is used for receiving the RF output signal RFOUT, and outputting the corresponding gain compensating signal GS to the current mirror circuit 310 according to voltage value or power value of the RF output signal RFOUT, so as to dynamically adjust current value of the first current I1 and third current I3 correspondingly and change bias region of the cascode amplifying circuit, which further compensates power gain of the low noise amplifier 300 in order to increase linearity.

In the following description is further instruction in teaching a work mechanism of the low noise amplifier 300.

To be detailed, in the present embodiment, current value of the first current I1 and third current I3 received by the bias circuit 320 determines voltage value of the first bias voltage VB1 and the second bias voltage VB2. Also, voltage value of the first bias voltage VB1 and the second bias voltage VB2 determines the operation bias point of the cascode amplifying circuit 330 and further determines linearity and power gain of the cascode amplifying circuit 330. Moreover, linearity of a general low noise amplifier decreases with input power of the RF input signal increased, which results in a decrease of power gain of the low noise amplifier. Therefore, the instant disclosure provides a low noise amplifier 300 that can dynamically adjusts the bias point with the increase of input power of the RF input signal RFIN. In a further instruction, when input power of the RF input signal RFIN received by the cascode amplifying circuit 330 increases, the low noise amplifier 300 receives the RF output signal RFOUT via power gain compensating circuit and correspondingly outputs the gain compensating signal GS to the current mirror circuit so as to dynamically adjust (or increase) current values of the first current I1 and third current I3. Afterwards, the bias circuit dynamically adjusts (or increases) voltage values of the first bias voltage VB1 and the second bias voltage VB2 according to current values of the first current I1 and the third current I3, which thereby compensates power gain of the low noise amplifier 300 in order to increase linearity of the communication circuit, that is, to increase the 1 dB gain compression point (P1 dB). In other words, current values of the first current I1 and the third current I3 increase correspondingly with input power of the RF input signal RFIN increased, which thereby dynamically adjusts voltage values of the first bias voltage VB1 and the second bias circuit VB2 outputted by the bias circuit 320.

For a specific instruction on an operation process of the low noise amplifier 300 of the instant disclosure, there is at least one of the embodiments for further instruction.

In the following embodiments, there are only parts different from embodiments in FIG. 3 described, and the omitted parts are indicated to be identical to the embodiments in FIG. 3. In addition, for an easy instruction, similar reference numbers or symbols refer to elements alike.

[Another Embodiment of the Low Noise Amplifier]

Figure 4:
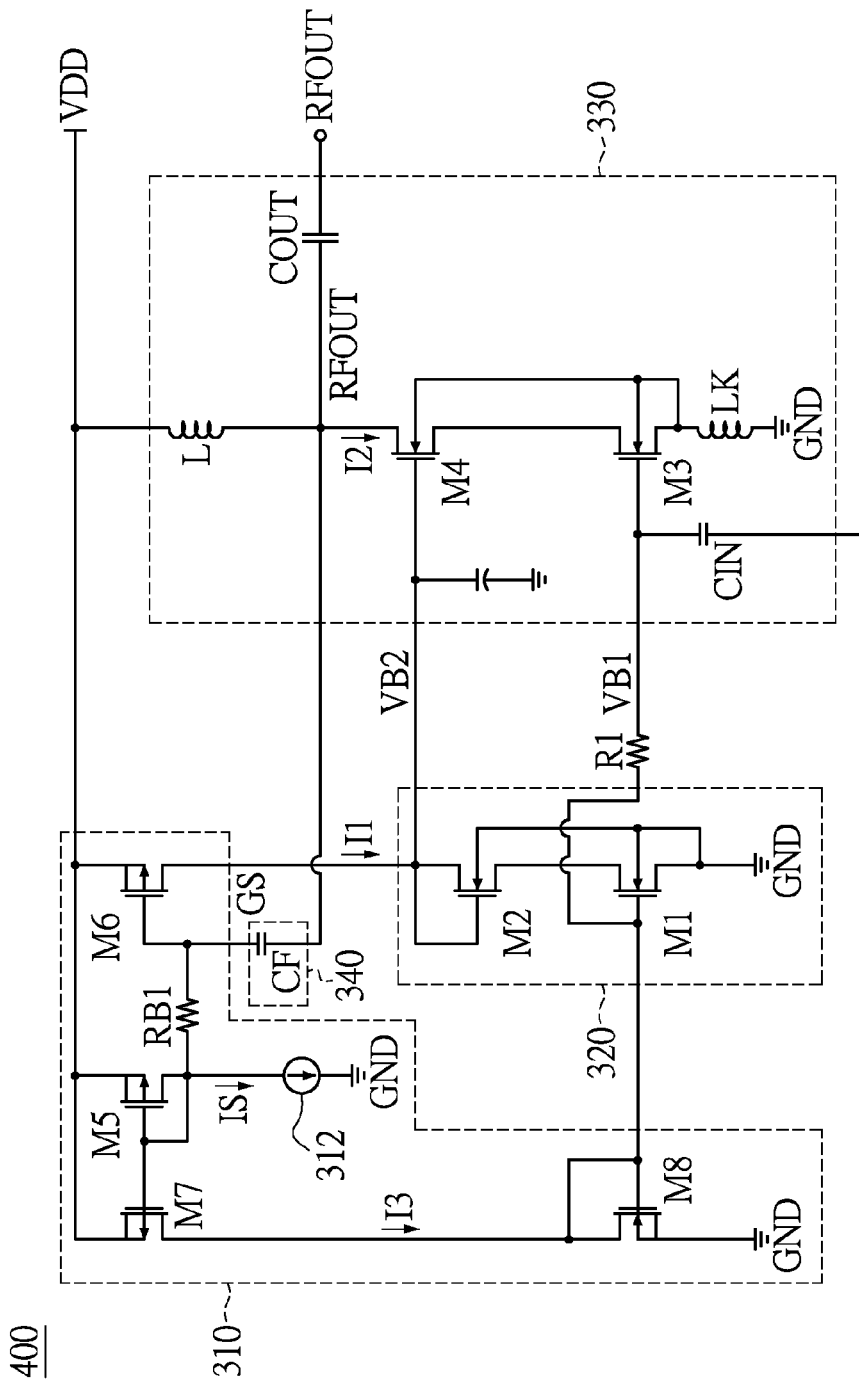
FIG. 4 shows a detailed circuit diagram of a low noise amplifier according to an embodiment of the instant disclosure.

Please refer to FIG. 4, FIG. 4 shows a detailed circuit diagram of a low noise amplifier according to an embodiment of the instant disclosure. Different from the embodiment shown in FIG. 3, in the low noise amplifier 400 of the present embodiment, the bias circuit 320 comprises a first transistor M1 and a second transistor M2. The cascode amplifying circuit 330 comprises an input capacitor CIN, a third transistor M3, a fourth transistor M4, an output capacitor COUT and an inductor L. The power gain compensating circuit 340 comprises a compensation capacitor CF. The current mirror circuit 310 comprises a bias current source 312, a fifth transistor M5, a sixth transistor M6, a seventh transistor M7 and an eighth transistor M8. In the present embodiment, if the low noise amplifier 400 is in a DC mode, the input capacitor CIN, the output capacitor COUT and the compensation capacitor CF are viewed as open circuits; if the low noise amplifier 400 is in an AC mode, the input capacitor CIN, the output capacitor COUT and the compensation capacitor CF are viewed as short circuits.

Gate of the first transistor M1 are connected to the current mirror circuit 310, and source of the first transistor M1 is connected to the ground voltage GND and gate of the first transistor M1 outputs the first bias voltage VB1 to the cascode amplifying circuit 330 via the first resistor R1. Drain and gate of the second transistor M2 are connected together and receives the first current I1. Source of the second transistor M2 is connected to drain of the first transistor M1, and drain of the second transistor M2 outputs the second bias voltage VB2 to the cascode amplifying circuit 330. One terminal of the input capacitor CIN is used for receiving the RF input signal RFIN. Gate of the third transistor M3 is connected to gate of the first transistor M1 via the first resistor R1 for receiving the first bias voltage VB1 and is directly connected to another terminal of the input capacitor CIN so as to receive the RF input signal RFIN. Source of the third transistor M3 is connected to the ground voltage GND via ground inductor LK. Gate of the fourth transistor M4 is connected to drain of the second transistor M2 and receives the second bias voltage VB2. Source of the fourth transistor M4 is connected to drain of the third transistor M3 and drain of the fourth transistor M4 receives a second current I2, wherein the second current I2 is output current of the low noise amplifier 400. One terminal of the output capacitor COUT is connected to drain of the fourth transistor M4, and another terminal of the output capacitor COUT outputs the RF output signal RFOUT. One terminal of the inductor L is connected to drain of the fourth transistor M4, and another terminal of the inductor L is connected to the system voltage VDD. One terminal of the compensation capacitor CF is connected to drain of the fourth transistor M4, and another terminal of the compensation capacitor CF is connected to the current mirror circuit 310. One terminal of the bias current source 312 is connected to the ground voltage GND and the bias current source 312 has a preset current IS. Gate and drain of the fifth transistor M5 are connected together and then connected to another terminal of the bias current source 312, and source of the fifth transistor M5 is connected to the system voltage VDD, wherein the fifth transistor M5 has a diode configuration. Gate of the sixth transistor M6 is connected to another terminal of the compensation capacitor CF so as to receive the gain compensating signal GS. Drain of the sixth transistor M6 is connected to drain of the second transistor M2 and outputs the first current I1, and source of the sixth transistor M6 is connected to the system voltage VDD. It is to be noticed that the current mirror circuit 310 further comprises a first feedback resistor RB1 and the first feedback resistor RB1 is connected between gate of the sixth transistor M6 and gate of the seventh transistor M7. Gate of the seventh transistor M7 is connected to gate of fifth transistor M5, source of the seventh transistor M7 is connected to the system voltage VDD, and drain of the seventh transistor M7 outputs a third current I3, wherein the third current I3 is mapping current of the preset current IS. Gate and drain of the eighth transistor M8 is connected together and connected to drain of the seventh transistor M7, and source of the eighth transistor M8 is connected to ground voltage GND, gate of the eighth transistor M8 is connected to gate of first transistor M1.

In the following description is further instruction in teaching a work mechanism of the low noise amplifier 400.

In the present embodiment, the designer can set the ratio (width/length) of the fifth transistor M5 and the sixth transistor M6 (larger than 1) so as to determine the ratio of the first current I1 and the preset current IS, and further set the ratio (width/length) of the fifth transistor M5 and the seventh transistor M7 (larger than 1) so as to determine the ratio of the third current I3 and the preset current IS. Afterwards, via circuit topology of the low noise amplifier 400 described above, the instant disclosure can dynamically adjust the first current I1 via feeding back the RF output signal RFOUT from output terminal of the low noise amplifier 400 to the sixth transistor M6. To be detailed, the third transistor M3 and the fourth transistor M4 works at the operation bias point according to the first bias voltage VB1 and the second bias voltage VB2 respectively. When the low noise amplifier 400 enters into AC mode and receives the RF input signal RFIN, that is, gate of the third transistor M3 receives the RF input signal RFIN, the third transistor M3 and the fourth transistor M4 amplifies input power of the RF input signal RFIN, and drain of the fourth transistor M4 outputs the RF output signal RFOUT. With the input power of the RF input signal RFIN increased, in order to increase the 1 dB gain compression point (P1 dB) for maintaining or increasing linearity of the low noise amplifier 400, the compensation capacitor CF receives the RF output signal RFOUT and accordingly outputs the gain compensating signal GS to the current mirror circuit 310 so as to dynamically adjust current value of the first current I1 correspondingly. In detail, when power of the RF input signal RFIN is smaller than a power threshold value, the first transistor M1 and third transistor M3 work at linear region so as to maintain linearity of the low noise amplifier 400. When power of the RF input signal is larger than a power threshold value, the first transistor M1 and third transistor M3 enter into saturation region from linear region and the first current I1 increases according to increasing of alternative current (ac) component of gate voltage of the sixth transistor M6, so as to increase voltage value of the first bias voltage VB1 and the second bias voltage VB2 and further compensate power gain of the low noise amplifier 400.

In other words, the instant disclosure feeds back the RF output signal RFOUT to gate of the sixth transistor M6 via the compensation capacitor CF so as to increase gate ac voltage of the sixth transistor M6 and then further increase current value (dc component) of the first current I1. Particularly, the gain compensating signal GS is the RF output signal RFOUT and gate ac voltage of the sixth transistor M6 increases with voltage of the gain compensating signal GS, and the sixth transistor M6 dynamically adjusts gate ac voltage according to the gain compensating signal GS, which further dynamically adjusts current value of the first current I1. After that, the first transistor M1 and the second transistor M2 dynamically adjusts (or increases) voltage values of the first bias voltage VB1 and the second bias voltage VB2 which are respectively provided to the third transistor M3 and the fourth transistor M4 by the first transistor M1 and the second transistor M2 according to the increased current value of the first current I1, and linearity of the low noise amplifier 400 is thereby increased. It is worth mentioning that, the third current I3 is steady current, that is the third current I3 does not be affected by gate voltage of the sixth transistor M6. Moreover, in the present embodiment, the transistors M1~M4 and M8 are NMOS transistors and the transistors M5~M7 are PMOS transistors, which are all based on CMOS process technology.

[Another Embodiment of the Low Noise Amplifier]

Figure 5:
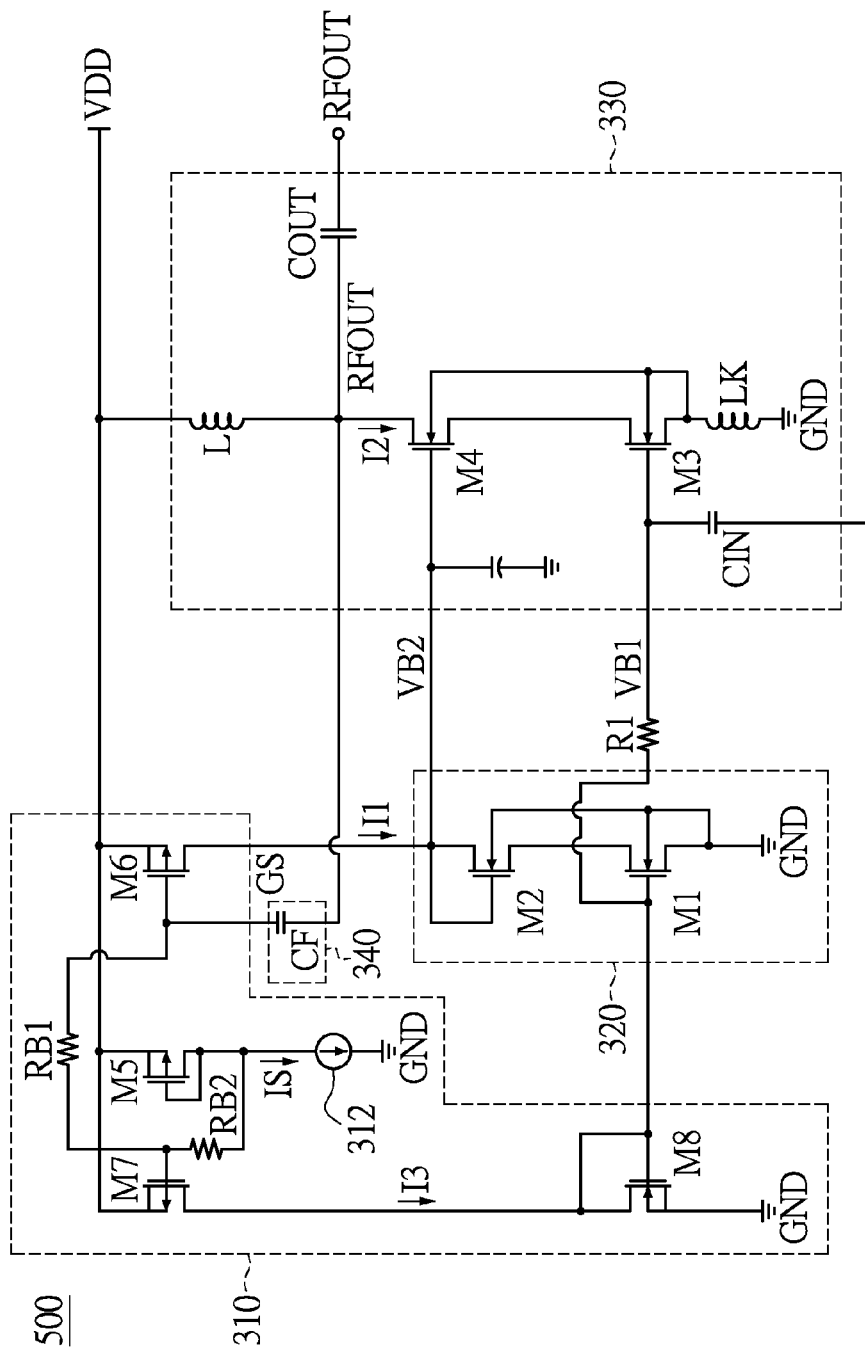
FIG. 5 shows a detailed circuit diagram of a low noise amplifier according to another embodiment of the instant disclosure.

Please refer to FIG. 5, FIG. 5 shows a detailed circuit diagram of a low noise amplifier according to another embodiment of the instant disclosure. Different from the embodiment shown in FIG. 3, in the low noise amplifier 500 of the present embodiment, the current mirror circuit 310 further comprises a second feedback resistor RB2 and the second feedback resistor RB2 is connected between gate of the fifth transistor M5 and gate of the seventh transistor M7. The current value of the third current I3 (the drain current of the seventh transistor M7) may be increased through ratio of resistor value between the first feedback resistor RB1 and the second feedback resistor RB2, so that current values of the first current I1 and the third current I3 may be correspondingly increased for increasing linearity of the low noise amplifier 500. Thus, the operation of the low noise amplifier 500 in accordance with the present embodiment is similar to that of the embodiment of FIG. 4, there's no need to go into details.

Figure 6:
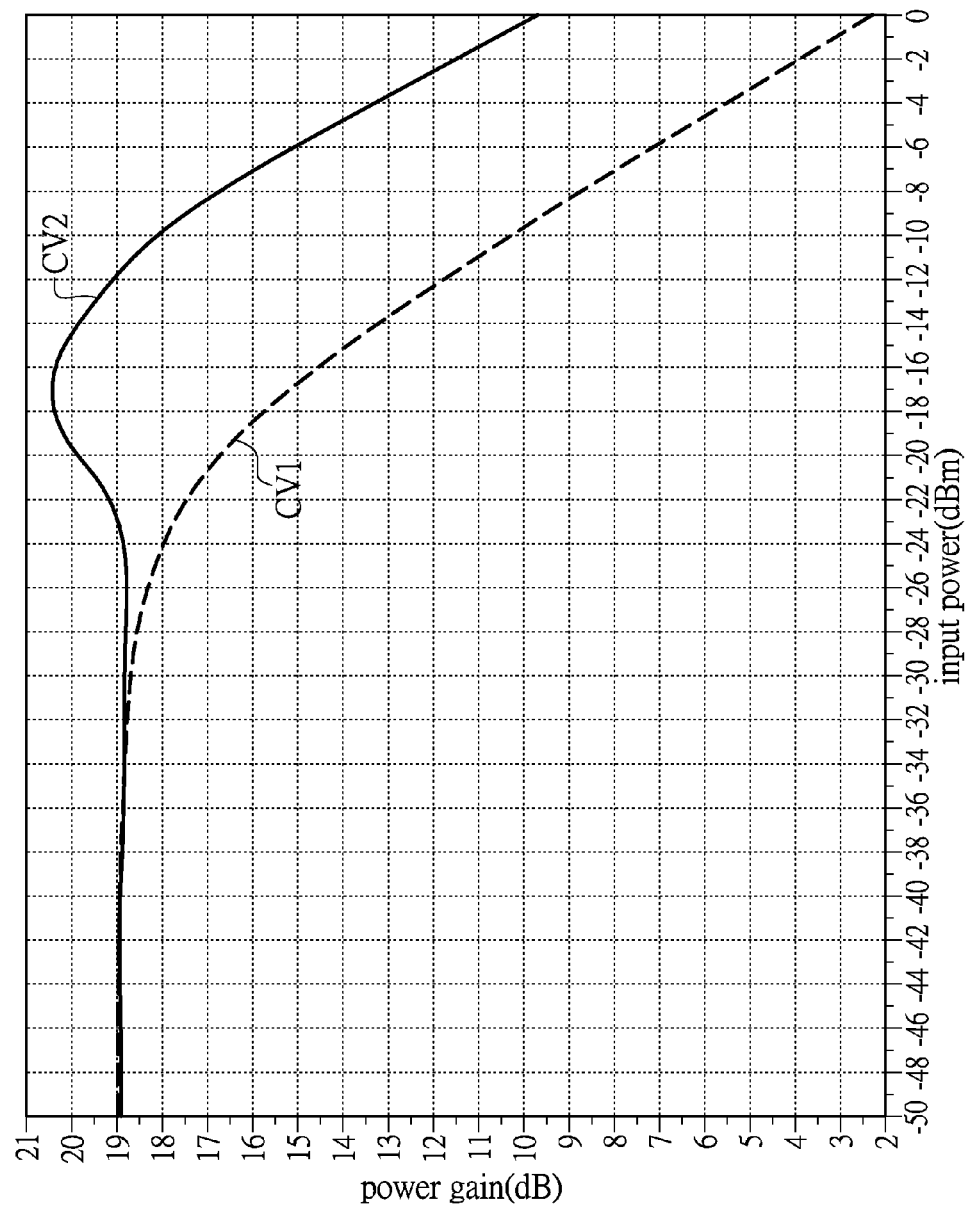
FIG. 6 shows a schematic simulation diagram of a low noise amplifier according to an embodiment of the instant disclosure.

In conjunction with FIG. 4 and FIG. 6 for understanding more about the present embodiment. FIG. 6 shows a schematic simulation diagram of a low noise amplifier according to an embodiment of the instant disclosure. In FIG. 6, a horizontal axis represents input power, a vertical axis represents power gain, and curve CV1 represents a simulation curve of a traditional low noise amplifier and curve CV2 represents a simulation curve of the low noise amplifier in the embodiment shown in FIG. 4. As shown in FIG. 6, P1 dB of the traditional low noise amplifier is −24 dBm, P1 dB of the low noise amplifier 400 of the present embodiment is −9.7 dBm, and thus P1 dB is increases by 14.3 dBm. Moreover, power gain of the low noise amplifier 300 has an increase phenomenon before starting to decrease, as shown in FIG. 6.

[One Embodiment of the Receiver]

Figure 7:
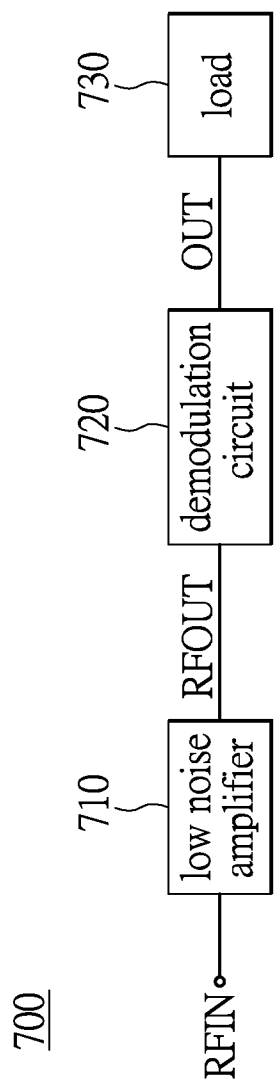
FIG. 7 shows a schematic block diagram of a receiver according to an embodiment of the instant disclosure.

Please refer to FIG. 7, FIG. 7 shows a schematic block diagram of a receiver according to an embodiment of the instant disclosure. The receiver 700 comprises a low noise amplifier 710, a demodulation circuit 720 and a load 730. The demodulation circuit 720 is electrically connected to the low noise amplifier 710. The load is electrically connected to the demodulation circuit 720. The demodulation circuit 720 is used for demodulating the RF output signal RFOUT and outputting a demodulation signal OUT to the load 730. The low noise amplifier 710 may be one of the low noise amplifier 300, 400 and 500 in the above embodiments, and receives the RF input signal RFIN from a base station via an antenna.

To sum up, the low noise amplifier and the receiver provided by the instant disclosure feedbacks the RF output signal to the current mirror circuit via the power gain compensating circuit so as to dynamically adjust the mapping current, which thereby compensates power gain of the low noise amplifier in order to increase linearity, in other words, to increase 1 dB gain compression point (P1 dB).

The invention can be implemented in any suitable form including hardware, software, firmware or any combination of these. The invention may optionally be implemented partly as computer software running on one or more data processors and/or digital signal processors. The elements and components of an embodiment of the invention may be physically, functionally and logically implemented in any suitable way. Indeed the functionality may be implemented in a single unit, in a plurality of units or as part of other functional units. As such, the invention may be implemented in a single unit or may be physically and functionally distributed between different units and processors.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A low noise amplifier, comprising:
   a current mirror circuit, providing a first current and a third current according to a system voltage and a preset current, wherein the first current and the third current are mapping current of the preset current;
   a bias circuit, electrically connected to the current mirror circuit, the bias circuit receiving the first current and third current and outputting a first bias voltage and a second bias voltage according to the first current and the third current;
   a cascode amplifying circuit, electrically connected to the bias circuit so as to respectively receive the first bias voltage and the second bias voltage, and accordingly to work at an operation bias point, the cascode amplifying circuit is used for receiving and amplifying a radio frequency (RF) input signal and accordingly outputting a RF output signal; and
   a power gain compensating circuit, electrically connected between the cascode amplifying circuit and the current mirror circuit, the power gain compensating circuit receiving the RF output signal and accordingly outputting a gain compensating signal to the current mirror circuit so as to dynamically adjust current values of the first current and the third current and change bias region of the cascode amplifying circuit, further compensating power gain of the low noise amplifier in order to increase 1 dB gain compression point (P1 dB).

2. The low noise amplifier according to claim 1, wherein current value of the first current increases correspondingly with power of the RF input signal, so as to dynamically adjust voltage values of the first bias voltage and the second bias voltage outputted by the bias circuit.

3. The low noise amplifier according to claim 1, wherein the bias circuit comprises:
   a first transistor, having gate connected to the current mirror circuit, having source connected to a ground voltage, and having gate outputting the first bias voltage to the cascode amplifying circuit via a first resistor; and
   a second transistor, having drain and gate connected together and receiving the first current, having source connected to drain of the first transistor, and having drain outputting the second bias voltage to the cascode amplifying circuit;
   wherein the first transistor and the second transistor dynamically adjust voltage values of the first bias voltage and the second bias voltage respectively according to current values of the first current and the third current.

4. The low noise amplifier according to claim 3, wherein the cascode amplifying circuit comprises:
   an input capacitor, having one terminal receiving the RF input signal;
   a third transistor, having gate connected to gate of the first transistor via the first resistor and receiving the first bias voltage, and directly connected to another terminal of the input capacitor so as to receive the RF input signal, having source connected to the ground voltage via ground inductor;
   a fourth transistor, having gate connected to drain of the second transistor and receiving the second bias voltage, and having source connected to drain of the third transistor and having drain receiving a second current;
   an output capacitor, having one terminal connected to drain of the fourth transistor, and having another terminal outputting the RF output signal; and
   an inductor, having one terminal connected to drain of the fourth transistor, and having another terminal connected to the system voltage;
   wherein the third transistor and the fourth transistor respectively work at the operation bias point according to the first bias voltage and the second bias voltage, and used for receiving and amplifying the RF input signal and accordingly outputting the RF output signal.

5. The low noise amplifier according to claim 4, wherein the power gain compensating circuit comprises:
   a compensation capacitor, having one terminal connected to drain of the fourth transistor, having another terminal connected to the current mirror circuit, and the compensation capacitor receiving the RF output signal and accordingly outputting the gain compensating signal to the current mirror circuit so as to dynamically adjust current value of the first current and the third current;
   wherein the gain compensating signal is the RF output signal.

6. The low noise amplifier according to claim 5, wherein the current mirror circuit comprises:
   a bias current source, having one terminal connected to the ground voltage, and the bias current source having a preset current;
   a fifth transistor, having gate and drain connected together and connected to another terminal of the bias current source, and having source connected to the system voltage;
   a sixth transistor, having gate connected to another terminal of the compensation capacitor so as to receive the gain compensating signal, having drain connected to drain of the second transistor and outputting the first current, and having source connected to the system voltage, wherein gate alternative current voltage of the sixth transistor equals to voltage of the gain compensating signal;
   a seventh transistor, having gate connected to gate of the fifth transistor, having source connected to the system voltage, and having drain outputting a third current, wherein the third current is mapping current of the preset current; and
   an eighth transistor, having gate and drain connected together and connected to drain of the seventh transistor for receiving the third current, and having source connected the ground voltage, wherein gate of the eighth transistor is connected to the gate of the first transistor;

wherein gate ac voltage of the sixth transistor is dynamically adjusted according to the gain compensating signal and further dynamically adjusts current value of the first current.

7. The low noise amplifier according to claim 6, wherein the current mirror circuit further comprises:
a first feedback resistor, having one terminal connected to gate of the sixth transistor, having another terminal connected to gate of the seventh transistor.

8. The low noise amplifier according to claim 7, wherein the current mirror circuit further comprises:
a second feedback resistor, having one terminal connected to gate of the seventh transistor, having another terminal connected to gate of the fifth transistor,
wherein the current value of the source current of the seventh transistor is increased through ratio of resistor value between the first feedback resistor and the second resistor, so that current value of the first current and the third current is correspondingly increased for increasing 1 dB gain compression point (P1 dB) of the low noise amplifier.

9. The low noise amplifier according to claim 6, wherein when power of the RF input signal is smaller than a power threshold value, the first transistor and third transistor work at linear region so as to maintain linearity of the low noise amplifier; when power of the RF input signal is larger than a power threshold value, the first transistor and third transistor enter into saturation region from linear region and the first current increases according to increasing of alternative current (ac) component of gate voltage of the sixth transistor, so as to increase voltage value of the first bias voltage and the second bias voltage and further compensate power gain of the low noise amplifier.

10. A receiver, comprising:
a low noise amplifier, receiving a radio frequency (RF) input signal and outputting a RF output signal;
a demodulation circuit, electrically connected to the low noise amplifier, the demodulation circuit demodulating the RF output signal and outputting a demodulation signal; and
a load, electrically connected to the demodulation circuit, the load receiving the demodulation signal;
wherein the low noise amplifier comprises:
a current mirror circuit, providing a first current and a third current according to a system voltage and a preset current, wherein the first current and the third current are mapping current of the preset current;
a bias circuit, electrically connected to the current mirror circuit, the bias circuit receiving the first current and the third current and outputting a first bias voltage and a second bias voltage according to the first current and the third current;
a cascode amplifying circuit, electrically connected to the bias circuit so as to respectively receive the first bias voltage and the second bias voltage, and accordingly to work at an operation bias point, the cascode amplifying circuit used for receiving and amplifying the RF input signal and accordingly outputting the RF output signal; and
a power gain compensating circuit, electrically connected between the cascode amplifying circuit and the current mirror circuit, the power gain compensating circuit receiving the RF output signal and accordingly outputting a gain compensating signal to the current mirror circuit so as to dynamically adjust current values of the first current and the third current and change bias region of the cascode amplifying circuit, further compensating power gain of the low noise amplifier in order to increase 1 dB gain compression point (P1 dB).

11. The receiver according to claim 10, wherein current value of the first current increases correspondingly with power of the RF input signal, so as to dynamically adjust voltage values of the first bias voltage and the second bias voltage outputted by the bias circuit.

12. The receiver according to claim 10, wherein the bias circuit comprises:
a first transistor, having gate connected to the current mirror circuit, having source connected to a ground voltage, and having gate outputting the first bias voltage to the cascode amplifying circuit via a first resistor; and
a second transistor, having drain and gate connected together and receiving the first current, having source connected to drain of the first transistor, and having drain outputting the second bias voltage to the cascode amplifying circuit;
wherein the first transistor and the second transistor dynamically adjust voltage value of the first bias voltage and the second bias voltage respectively according to current value of the first current and the third current.

13. The receiver according to claim 12, wherein the cascode amplifying circuit comprises:
an input capacitor, having one terminal receiving the RF input signal;
a third transistor, having gate connected to gate of the first transistor via the first resistor and receiving the first bias voltage, and directly connected to another terminal of the input capacitor so as to receive the RF input signal, having source connected to the ground voltage via ground inductor;
a fourth transistor, having gate connected to drain of the second transistor and receiving the second bias voltage, and having source connected to drain of the third transistor and having drain receiving a second current;
an output capacitor, having one terminal connected to drain of the fourth transistor, and having another terminal outputting the RF output signal; and
an inductor, having one terminal connected to drain of the fourth transistor, and having another terminal connected to the system voltage;
wherein the third transistor and the fourth transistor respectively work at the operation bias point according to the first bias voltage and the second bias voltage, and used for receiving and amplifying the RF input signal and accordingly outputting the RF output signal.

14. The receiver according to claim 13, wherein the power gain compensating circuit comprises:
a compensation capacitor, having one terminal connected to drain of the fourth transistor, having another terminal connected to the current mirror circuit, and the compensation capacitor receiving the RF output signal and accordingly outputting the gain compensating signal to the current mirror circuit so as to dynamically adjust current value of the first current and third current;
wherein the gain compensating signal is the RF output signal.

15. The receiver according to claim 14, wherein the current mirror circuit comprises:
a bias current source, having one terminal connected to the ground voltage, and the bias current source having a preset current;

a fifth transistor, having gate and drain connected together and connected to another terminal of the bias current source, and having source connected to the system voltage;

a sixth transistor, having gate connected to another terminal of the compensation capacitor so as to receive the gain compensating signal, having drain connected to drain of the second transistor and outputting the first current, and having source connected to the system voltage, wherein gate alternative current voltage of the sixth transistor equals to voltage of the gain compensating signal;

a seventh transistor, having gate connected to gate of the fifth transistor, having source connected to the system voltage, and having drain outputting a third current, wherein the third current is mapping current of the preset current; and an eighth transistor, having gate and drain connected together and connected to drain of the seventh transistor, and having source connected the ground voltage and having gate connected to the gate of the first transistor;

wherein gate ac voltage of the sixth transistor is dynamically adjusted according to the gain compensating signal and further dynamically adjusts current value of the first current.

16. The receiver according to claim 15, wherein when power of the RF input signal is smaller than a power threshold value, the first transistor and third transistor work at linear region so as to maintain linearity of the low noise amplifier; when power of the RF input signal is larger than a power threshold value, the first transistor and third transistor enter into saturation region from linear region and the first current increases according to increasing of alternative current (ac) component of gate voltage of the sixth transistor, so as to increase voltage value of the first bias voltage and the second bias voltage and further compensate power gain of the low noise amplifier.

* * * * *